United States Patent
Yeh

(10) Patent No.: US 8,052,445 B2
(45) Date of Patent: Nov. 8, 2011

(54) ZERO INSERTION FORCE CONTACT AND SOCKET CONNECTOR HAVING THE CONTACT

(75) Inventor: Cheng-Chi Yeh, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/849,055

(22) Filed: Aug. 3, 2010

(65) Prior Publication Data

US 2011/0034052 A1    Feb. 10, 2011

(30) Foreign Application Priority Data

Aug. 4, 2009   (TW) ............................... 98214398 U

(51) Int. Cl.
*H01R 13/15* (2006.01)
(52) U.S. Cl. ........................ 439/259; 439/342
(58) Field of Classification Search .................. 439/259, 439/342, 856, 857
See application file for complete search history.

(56) References Cited

U.S. PATENT DOCUMENTS

| | | | | |
|---|---|---|---|---|
| 6,142,810 A * | 11/2000 | Hsiao et al. | .................... | 439/342 |
| 6,375,485 B1 * | 4/2002 | Lin | ............................. | 439/342 |
| 6,443,752 B1 * | 9/2002 | Kosawa | ........................ | 439/342 |
| 6,533,591 B1 * | 3/2003 | Lee | ............................. | 439/83 |
| 6,554,633 B1 * | 4/2003 | Nobuyuki et al. | ............. | 439/342 |
| 6,733,320 B2 * | 5/2004 | Kukita et al. | ................ | 439/342 |
| 7,867,007 B2 * | 1/2011 | Szu | ............................. | 439/342 |
| 7,896,678 B2 * | 3/2011 | Zhang | .......................... | 439/342 |

FOREIGN PATENT DOCUMENTS

TW          M336581          7/2008

* cited by examiner

*Primary Examiner* — Hae Moon Hyeon
(74) *Attorney, Agent, or Firm* — Ming Chieh Chang; Wei Te Chung; Andrew C. Cheng

(57) ABSTRACT

A contact (2) includes a fixed portion (21) in a first, vertical direction, a soldering portion (20) bending from a lower end of the fixed portion and extending in a second, horizontal direction, and an inversed U-shaped extension portion (29) extending from an upper end of the fixed portion and facing to the soldering portion. The extension portion has a pair of spaced arm portions (22, 28) and a connecting portion (23) connecting with the spaced arm portions. The contact further includes a first elastic portion (24) connecting to one of the arm portions and a second elastic portion (25) connecting to the other one of the arm portions. The first elastic portion and the second elastic portion laterally extend from a same side of the extension portion and extend in a third direction perpendicular to the vertical direction and the horizontal direction.

15 Claims, 3 Drawing Sheets

ZERO INSERTION FORCE CONTACT AND SOCKET CONNECTOR HAVING THE CONTACT

BACKGROUND OF THE INVENTION

1. Field of the Invention

The present invention relates generally to a ZIF (Zero Insertion Force) contact and a socket connector having the ZIF contact, and more particularly to ZIF contacts with small arrangement distance therebetween before being cut from a terminal material belt and the socket connector having the ZIF contacts.

2. Description of Related Arts

TW Pat. No. M336581 issued to Molex on Jul. 11, 2008 discloses a terminal and an electrical connector which is provided with the terminal. The terminal includes a fixing part, a first elastic arm and a second elastic arm, two contact parts, two guide parts and a welding part. The fixing part is provided with a front panel and a top end part. The first elastic arm, the second elastic arm and the fixing part are punched on the same panel to lead the first elastic arm and the second elastic arm to respectively, parallelly extend upwards from the top end part of the fixing part. The contact parts extend respectively forwards from the top ends of the first elastic arm and the second elastic arm with a drop height in an upper-lower direction and an offset in a left-right direction. The guide parts oppositely extend and shape to the front respectively from the tail ends of the two contact parts for defining a larger space therebetween for insertion of pin legs of a CPU. Therefore, the size of the terminal can be shortened. Moreover, the arrangement distance of the terminal on a terminal material belt can be shortened to realize the single-pitch (one pitch) arrangement on the terminal material belt as well as reduce the size of the electrical connector or increase the terminal arrangement density of the electrical connector. The contact has such a complicated structure that the manufacturing process is troublesome.

Hence, a socket connector and the contacts received in the socket connector are desired to overcome the aforementioned disadvantage of the prior art.

SUMMARY OF THE INVENTION

Accordingly, an object of the present invention is to provide a contact simply manufactured and a socket connector providing the contacts.

To achieve the above object, a contact includes a fixed portion in a first, vertical direction, a soldering portion bending from a lower end of the fixed portion and extending in a second, horizontal direction, and an inversed U-shaped extension portion extending from an upper end of the fixed portion and facing to the soldering portion. The extension portion has a pair of spaced arm portions and a connecting portion connecting with the spaced arm portions. The contact further includes a first elastic portion connecting to one of the arm portions and a second elastic portion connecting to the other one of the arm portions. The first elastic portion and the second elastic portion laterally extend from a same side of the extension portion and extend in a third direction perpendicular to the vertical direction and the horizontal direction.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
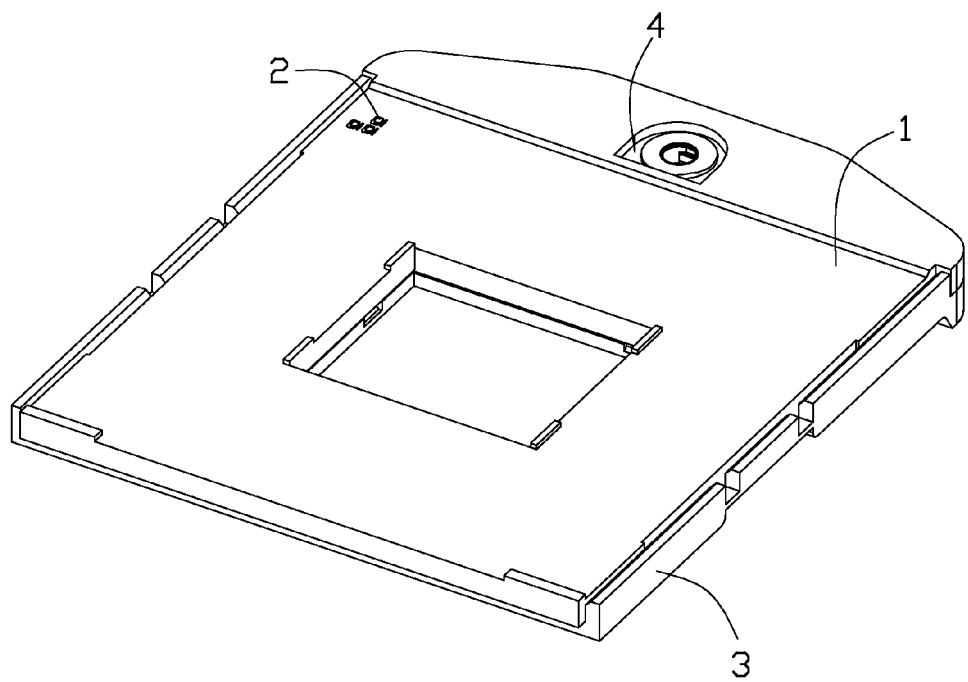
FIG. 1 is a perspective, assembled view of a socket connector constructed in accordance with the present invention.
Figure 2:
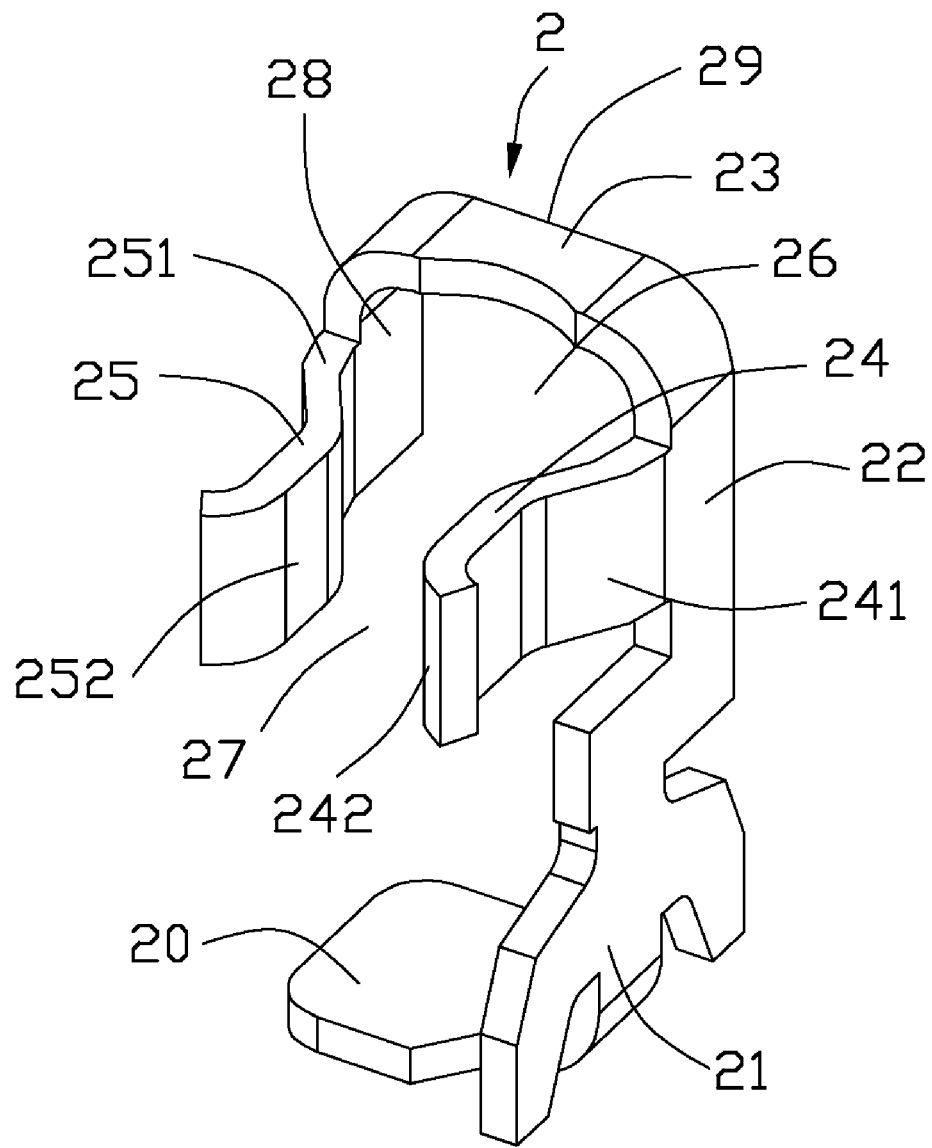
FIG. 2 is a perspective view of a contact of the prevent invention.
Figure 3:
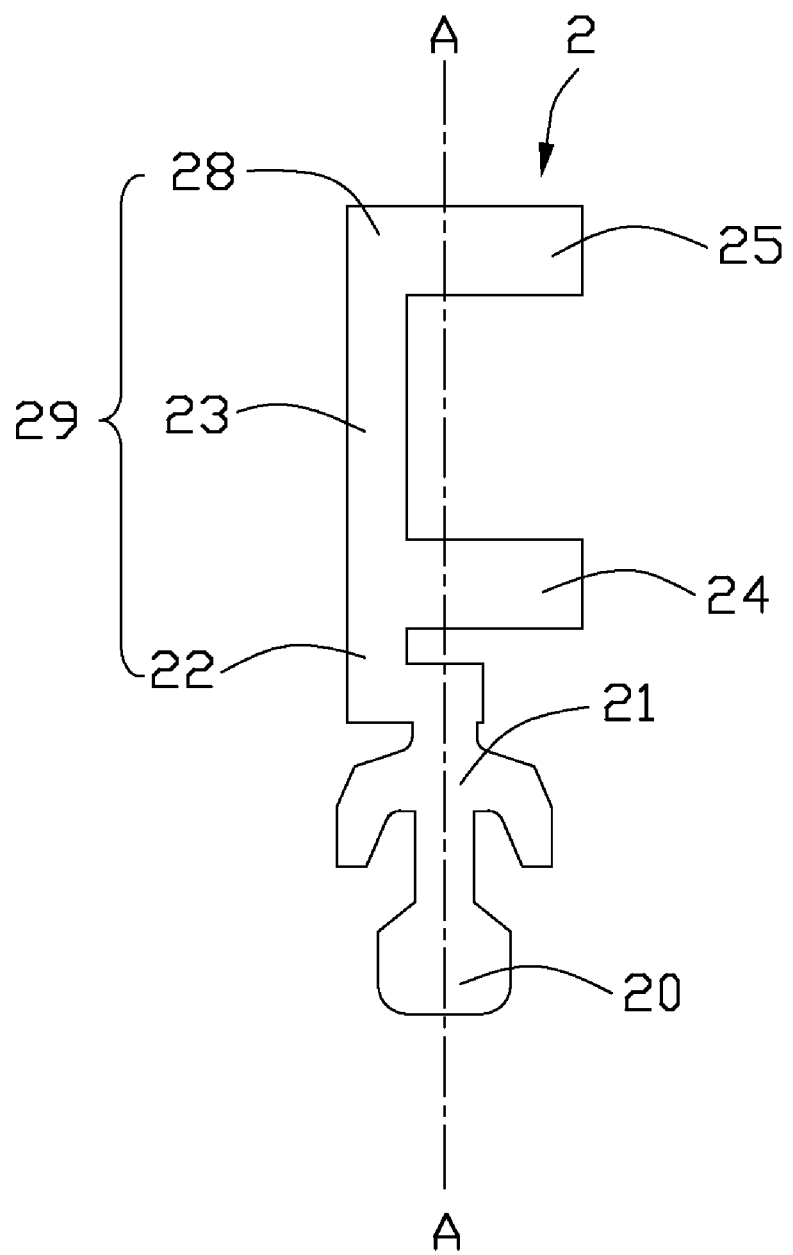
FIG. 3 is a flat piece of the contact before the contact is forged into the final figure.

Referring to FIGS. 1-3, a socket connector 100 of the present invention, used for connecting with a CPU (Central Processing Unit, not shown), comprises a base (or alternatively named as an insulative housing) 3, a plurality of contacts 2 received in the base 3, an insulative cover 1 attached onto the base 3 and moveable between an open position at which the contacts 2 disconnect with pins of the CPU and a closed position at which the contacts 2 electrically connect with the pins of the CPU, and an actuating element 4 of known design suitable for causing the movement of the insulative cover 1 relative to the base 3 in a condition that a user rotates the actuating element 4 by a tool (not shown).

Referring to FIGS. 2 and 3, the contact 2 comprises a fixed portion (or alternatively named as a fixing portion) 21, a soldering portion 20 bending laterally from a lower end of the fixed portion 21, an inversed U-shaped extension portion 29 extending from an upper end of the fixed portion 21 and facing to the soldering portion 20, a first elastic portion 24 and a second elastic portion 25 both extending from the extension portion 29. The fixing portion 21 defines a center line A-A, and the extension portion 29 is located offset from said center line A-A. The inversed U-shaped extension portion 29 comprises a first arm portion 22 connecting to the fixed portion 21, a second arm portion 28, and a connecting portion 23 connecting with the first arm portion 22 and the second arm portion 28. The connecting portion 23 bends vertically from an upper end of the first arm portion 22 and the second arm portion 28 bends downwardly from an end of the connecting portion 23. The connecting portion 23 is located above the soldering portion 20. The first elastic portion 24 and the second elastic portion 25 extend similarly, respectively from the first arm portion 22 and the second arm portion 28 of the extension portion 29. The first elastic portion 24 comprises a first contact portion 241 connecting to the first arm portion 22 and a first guiding portion 242 extending forwardly and outwardly from the first contact portion 241. Similarly, the second elastic portion 25 comprises a second contact portion 251 connecting to the second arm portion 28 and a second guiding portion 252 extending forwardly and outwardly from the second contact portion 251. A first interspace 26 is defined between the first contact portion 241 and the second contact portion 251. A second interspace 27 is defined between the first guiding portion 242 and the second guiding portion 252, which is larger than the first interspace 26. Commonly, the fixed portion 21 extend in a first, vertical direction, the soldering portion 20 extend in a second, horizontal direction, and the elastic portions 24, 25 extend in a third direction perpendicular to the vertical direction and the horizontal direction. In fact, one of the first, the second and the third directions is perpendicular to the others.

Referring to FIGS. 1 and 2, the base 3 defines a plurality of passageways (not shown) and the insulative cover 1 defines a plurality of openings (not labeled) corresponding to the passageways. The contacts 2 are received in the passageways of the base 3, with a plurality of soldering portions 20 extending below the base 3 for soldering with a plurality of tin balls (not shown). The contacts 2 protrude into and are received in the openings of the insulative cover 1 for connecting with pins of the CPU.

Referring to FIGS. 1 and 2, when the CPU is assembled onto an upper face of the inslative cover 1, a pin leg of the CPU is inserted into the second interspace 27 of the contact 2 with zero insertion force, and then moves to the first interspace 26 accompanying with the movement of the insulative cover 1. The pin legs of the CPU are reliably sandwiched between the contact portions 241, 251 and achieve reliable electrical connection between the CPU and the socket connector 100.

Particularly referring to FIG. 3, the contact 2 is shown as a flat piece before the contact 2 is forged into the final figure. The extension portion 29 extends from a top end of the fixed portion 21 along a first direction and the first elastic portion 24 and the second elastic portion 25 both extend from the same side of the extension portion 29 along a second direction transverse to the first direction. The extension portion 29 cooperates the first elastic portion 24, the second elastic portion 25 for shaping as an "F".

In the present invention, because the first elastic portion 24 and the second elastic portion 25 both extend from a same extension portion 29 and are spaced each other in an upper-lower direction when the contact 2 are lied on the terminal material belt, each contact 2 is small and the distance between the adjacent two contacts 2 is shortened. The contacts 2 realize the single-pitch (one pitch) arrangement on the terminal material belt. Therefore, the size of the socket connector 100 is reduced and the terminal arrangement density of the electric connector is increased. Moreover, the contacts 2 are simply and easily manufactured.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A contact comprising:
   a fixed portion in a first, vertical direction;
   a soldering portion bending from a lower end of the fixed portion and extending in a second, horizontal direction;
   an inversed U-shaped extension portion extending from an upper end of the fixed portion and facing to the soldering portion, the extension portion having a pair of spaced arm portions and a connecting portion connecting with the spaced arm portions;
   a first elastic portion connecting to one of the arm portions; and
   a second elastic portion connecting to the other one of the arm portions; wherein
   the first elastic portion and the second elastic portion laterally extend from a same side of the extension portion and extend in a third direction perpendicular to the vertical direction and the horizontal direction.

2. The contact as claimed in claim 1, wherein the first elastic portion comprises a first contact portion connecting to the first arm portion, the second elastic portion comprises a second contact portion connecting to the second arm portion, and a first interspace is defined between the first contact portion and the second contact portion.

3. The contact as claimed in claim 2, wherein the first elastic portion comprises a first guiding portion extending from the first contact portion, the second elastic portion comprises a second guiding portion extending from the second contact portion, and a second interspace is defined between the first guiding portion and the second guiding portion.

4. The contact as claimed in claim 3, wherein the second interspace is larger than the first interspace.

5. The contact as claimed in claim 1, wherein a flat extension portion through which the U-shaped extension portion is bent, cooperates the first elastic portion, the second elastic portion for shaping as an "F".

6. A socket connector, used for connecting with a CPU (Central Processing Unit), comprising:
   a base defining a plurality of passageways;
   an insualtive cover attached onto the base and moveable between an open position and a closed position, the insulative cover defining a plurality of openings corresponding to the passageways;
   an actuating element for causing the movement of the insulative cover relative to the base; and
   a plurality of contacts partly received in the passageways and partly extending into the openings of the cover for connecting pins of the CPU, each contact comprising:
   a fixed portion;
   a soldering portion bending from a lower end of the fixed portion;
   an inversed U-shaped extension portion extending from an upper end of the fixed portion and facing to the soldering portion, the extension portion having a first arm portion connecting to the fixed portion, a second arm portion parallel to the first arm portion, and a connecting portion connecting with the first arm portion and the second arm portion;
   a first elastic portion connecting to the first arm portion; and
   a second elastic portion connecting to the second arm portion; wherein
   the first elastic portion and the second elastic portion laterally extend from a same side of the extension portion.

7. The socket connector as claimed in claim 6, wherein the first elastic portion comprises a first contact portion connecting to the first arm portion, the second elastic portion comprises a second contact portion connecting to the second arm portion, and a first interspace is defined between the first contact portion and the second contact portion.

8. The socket connector as claimed in claim 7, wherein the first elastic portion comprises a first guiding portion extending from the first contact portion, the second elastic portion comprises a second guiding portion extending from the second contact portion, and a second interspace is defined between the first guiding portion and the second guiding portion.

9. The socket connector as claimed in claim 8, wherein the second interspace is larger than the first interspace.

10. The socket connector as claimed in claim 6, wherein a flat extension portion through which the U-shaped extension portion is bent, cooperates the first elastic portion, the second elastic portion for shaping as an "F".

11. The socket connector as claimed in claim 6, wherein the soldering portions of the contacts extend below the base for soldering with a plurality of tin balls.

12. The socket connector as claimed in claim 6, wherein the fixed portion, the soldering portion, and the elastic portions extend in three directions, each one perpendicular to the others.

13. An electrical connector for use with an electronic package having pins thereof, comprising:
   an insulative housing defining a plurality of passageways upwardly communicating with an exterior;
   a plurality of contacts disposed in the corresponding passageways, respectively, each of said contacts defining a fixing portion, a soldering portion below the fixing portion, and an extension portion above the fixing portion, said extension portion having an upside-down U-shaped configuration in the corresponding passageway, said extension portion defining opposite elongated side edges, and a pair of elastic portions spaced from each other in a horizontal direction in the corresponding passageways to define a horizontal space therebetween for receiving a pin of the electronic package, while commonly extending from a same side edge of said extension portion for allowing saving material during manufacturing.

14. The electrical connector as claimed in claim 13, wherein the fixing portion defines a center line, and the extension portion is located offset from said center line.

15. The electrical connector as claimed in claim 13, wherein in an extended planar manner before formed to a final shape, in each contact the pair of elastic portions occupy an upper half and the fixing portion and the soldering portion occupy a lower half.

* * * * *